United States Patent [19]

Katou et al.

[11] Patent Number: 5,342,739
[45] Date of Patent: Aug. 30, 1994

[54] METHOD OF PREPARING A NEGATIVE PATTERN UTILIZING PHOTOSENSITIVE POLYMER COMPOSITION CONTAINING QUINONEDIAZIDE COMPOUND AND A POLY(AMIDO)IMIDE PRECURSOR

[75] Inventors: Kouichi Katou; Hirotoshi Maeda, both of Yokohama; Kouichi Kunimune, Chiba, all of Japan

[73] Assignee: Chisso Corporation, Osaka, Japan

[21] Appl. No.: 938,139

[22] PCT Filed: Feb. 25, 1992

[86] PCT No.: PCT/JP92/00201

§ 371 Date: Oct. 22, 1992

§ 102(e) Date: Oct. 22, 1992

[87] PCT Pub. No.: WO92/15045

PCT Pub. Date: Sep. 3, 1992

[30] Foreign Application Priority Data

Feb. 25, 1991 [JP] Japan .................. 3-053288

[51] Int. Cl.$^5$ .............................................. G03F 7/023
[52] U.S. Cl. ..................................... 430/325; 320/192; 320/327; 320/330; 320/331
[58] Field of Search ............... 430/192, 193, 165, 197, 430/167, 325, 330, 327, 331, 191; 525/434, 436; 528/329.1, 350, 353

[56] References Cited

U.S. PATENT DOCUMENTS

| | | |
|---|---|---|
| 4,093,461 | 6/1978 | Loprest et al. |
| 4,395,482 | 7/1983 | Ahne et al. .................. 430/326 |
| 4,880,722 | 11/1989 | Moreau et al. ................ 430/192 |
| 4,927,736 | 5/1990 | Maeller et al. ................ 430/192 |
| 4,942,108 | 7/1990 | Moreau et al. ................ 430/192 |
| 5,037,720 | 8/1991 | Khanna ........................ 430/192 |

FOREIGN PATENT DOCUMENTS

| | | |
|---|---|---|
| 0287212 | 10/1988 | European Pat. Off. |
| 0337698 | 10/1989 | European Pat. Off. |
| 0526650 | 2/1993 | European Pat. Off. |
| 54-145794 | 11/1979 | Japan . |
| 55-45746 | 3/1980 | Japan . |
| 55-41422 | 10/1980 | Japan . |
| 60-6729 | 1/1985 | Japan . |
| 60-100143 | 6/1985 | Japan . |
| 61-88255 | 6/1986 | Japan . |
| 64-60630 | 3/1989 | Japan . |
| 4218051 | 8/1992 | Japan . |

Primary Examiner—Charles L. Bowers, Jr.
Assistant Examiner—Christopher G. Young
Attorney, Agent, or Firm—Leydig, Voit & Mayer

[57] ABSTRACT

A method of preparing a negative type pattern of a polyimide film is provided which includes applying to a substrate a sufficient amount of a photosensitive polymer composition to form a negative type pattern, the photosensitive polymer composition comprising a mixture of a poly(amido)imide precursor containing a repeating unit represented by the following formula (I), at least one kind of quinonediazide compound and an organic solvent:

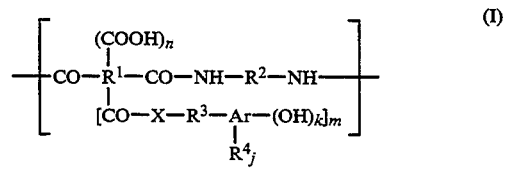

$R^1$ is a trivalent or a tetravalent carbocyclic aromatic group or heterocyclic group; $R^2$ is an aliphatic group having at least two carbon atoms, an alicyclic group, an aromatic aliphatic group, a carbocyclic aromatic group, a heterocyclic group or a polysiloxane group; X is —O— or $NR^5$—, where $R^5$ is a hydrogen atom or a monovalent organic group having 10 or less carbon atoms; $R^3$ is a divalent organic group; $R^4$ is a hydrogen atom or a monovalent organic group having 20 or less carbon atoms; Ar is a hexavalent or decavalent organic group represented by the formula (Abstract continued on next page.)

-continued

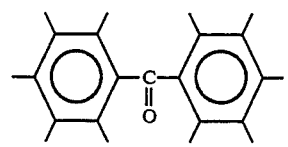

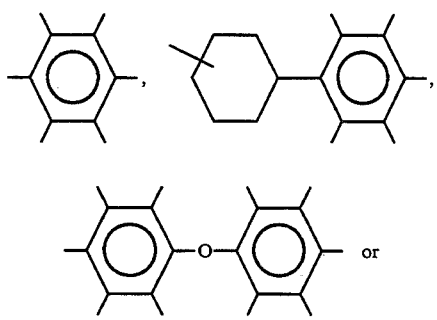

or k is an integer of $1 \leq k \leq 5$, and $j+k+l$ is equal to the valence of Ar; m is independently 1 or 2; n is independently 0 or 1 and the values of m and n are in the range of $1 \leq m+n \leq 2$; prebaking the composition at 50°–130° C.; irradiating the composition through a mask with actinic radiation to form an irradiated composition; developing the irradiated composition with a developing solution comprising a basic solution of a basic substance in a solvent comprising 0 to 10 parts by weight of water and 100 to 90 parts by weight of a water-soluble organic solvent to remove unexposed portions of the composition and form a negative type pattern; rinsing and drying the pattern; and post-baking the pattern at 200°–500° C.

5 Claims, 2 Drawing Sheets

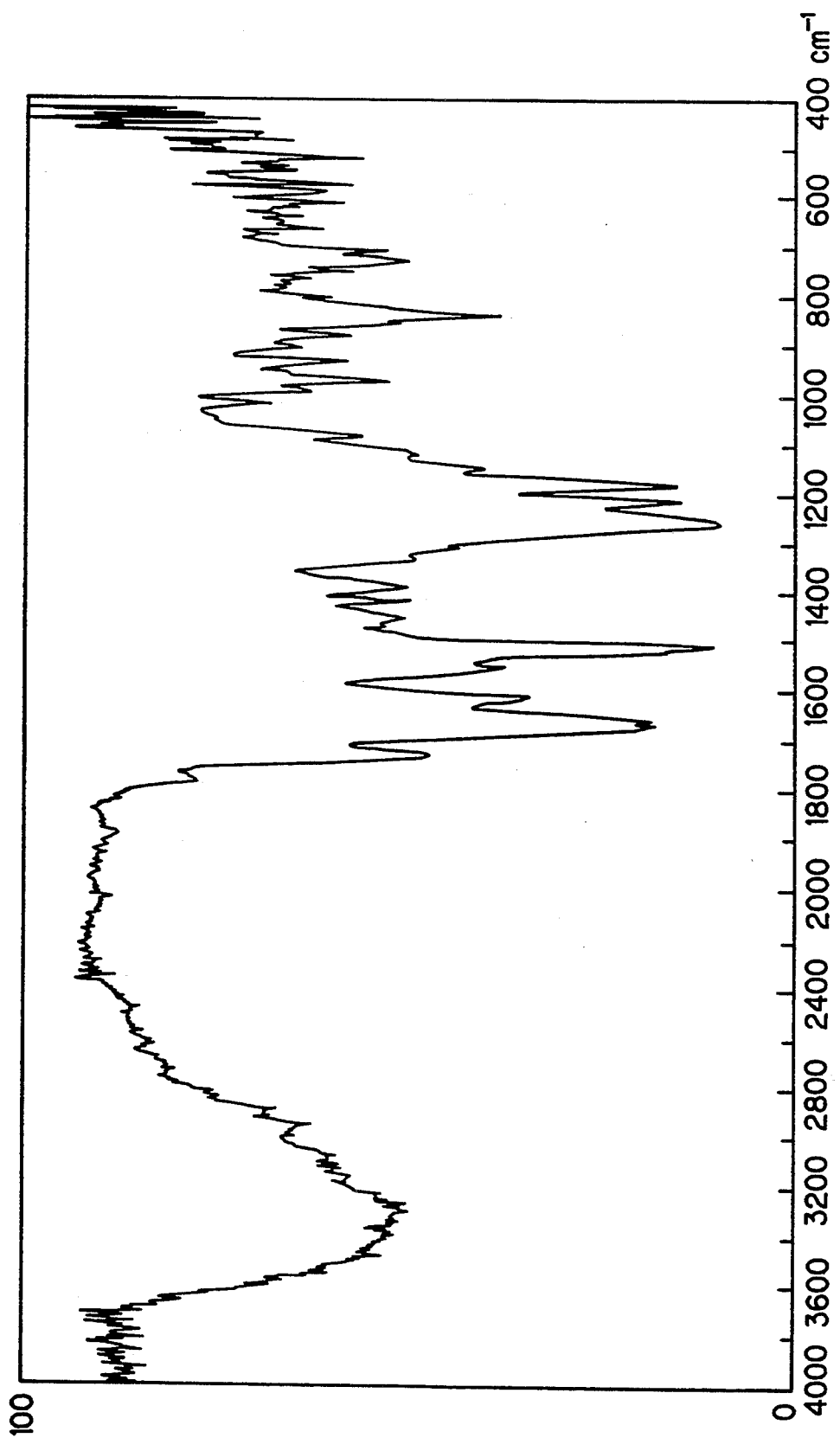
F I G. 1

METHOD OF PREPARING A NEGATIVE PATTERN UTILIZING PHOTOSENSITIVE POLYMER COMPOSITION CONTAINING QUINONEDIAZIDE COMPOUND AND A POLY(AMIDO)IMIDE PRECURSOR

TECHNICAL FIELD

The present invention relates to a novel photosensitive polymer composition having excellent shelf stability and high sensitivity and a method for forming a patterned polyimide film by the use of this composition.

BACKGROUND ART

As a heat-resistant photosensitive material, a photosensitive polyimide is widely used in insulating films for semiconductors, passivation films and the like, but it has various problems.

For example, Japanese Patent Application Laid-open No. 54-145794 has suggested a method for mixing a compound containing a double bond and an amino group or its quaternary salt with a polyamic acid. However, since a large amount of the compound containing the amino group or its quaternary salt is added to the unstable polyamic acid solution, there is a drawback that the viscosity of the solution increases with time. Japanese Patent Application Laid-open Nos. 55-45746 and 60-100143 have suggested a method for involving reacting an unsaturated epoxy compound or an isocyanate compound having a double bond with the carboxyl group of a polyamic acid, but this method has a drawback that when the photosensitive unsaturated group-containing compound is reacted with the carboxyl group of the polyamic acid, a part of the polyamic acid decomposes, so that the viscosity of the solution changes. In Japanese Patent Publication No. 55-41422, there has been suggested a polymer in which an active functional group such as a double bond is introduced into the ester side chain of the polyamic acid, but when an acid chloride is reacted with diamine, a chloride remains as an impurity and the removal of this impurity is troublesome. Furthermore, Japanese Patent Application Laid-open No. 60-6729 has suggested a method in which a diamine having a double bond is first synthesized and a polyimide is then synthesized by the use of this diamine, but the process of introducing a photosensitive functional group is complex and a considerable cost is taken.

U.S. Pat. No. 4,093,461 has reported a positive type heat-resistant resist obtained by adding a quinonediazide compound to a polyamic acid, but this resist has a disadvantage that the solubility of the polyamic acid in an alkali is too high, so that film loss is noticeable at the time of development and resolution is poor. U.S. Pat. No. 4,395,482 has reported a positive type heat-resistant resist obtained by adding a quinonediazide compound to a polyoxazole precursor synthesized from a diamine containing a hydroxyl group and a polycarboxylic acid, and Japanese Patent Application Laid-open No. 64-60630 has reported a positive type heat-resistant resist obtained by adding a quinonediazide compound to a polyamidoimide synthesized from a diamine containing a hydroxyl group and tetracarboxylic dianhydride. However, the hydroxyl group-containing diamine has a strong absorption in an ultraviolet region, so that the resist has a drawback that sensitivity is poor.

As is apparent from the foregoing, the conventional techniques have various problems, and thus it is desired to develop a photosensitive material by which such problems can be solved.

DISCLOSURE OF THE INVENTION

An object of the present invention is to provide a photosensitive polymer composition having excellent shelf stability and good sensitivity obtained by using a photosensitive polymer which can be easily manufactured and contains less impurities, and another object of the present invention is to provide a method for preparing a patterned poly(amido)imide film by the use of this composition.

In order to solve the above-mentioned problems, the present inventors have intensively conducted investigations, and as a result, they have found that for the purpose of obtaining a positive type heat-resistant resist by the use of a quinonediazide compound and a polyamic acid, it is necessary to make the solubility of the polyamic acid in an alkali substantially equal to that of a novolak resin. In consequence, the present invention has been attained. That is, the present invention is directed to a photosensitive polymer composition mainly comprising a poly(amido)imide precursor represented by the following formula (I), a quinonediazide compound and an organic solvent:

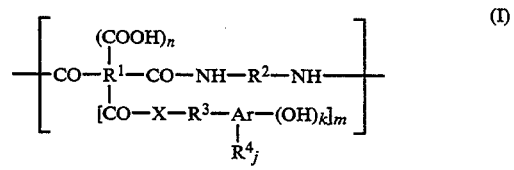

wherein $R^1$ is a trivalent or a tetravalent carbon cyclic aromatic group or heterocyclic group; $R^2$ is an aliphatic group having at least two carbon atoms, an alicyclic group, an aromatic aliphatic group, a carbon cyclic aromatic group, a heterocyclic group or a polysiloxane group; X is $-NR^5-$ ($R^5$ is a monovalent hydrogen atom or an organic group having 10 or less carbon atoms) or $-O-$; $R^3$ is a divalent organic group; $R^4$ is a hydrogen atom or a monovalent organic group having 20 or less carbon atoms; Ar is a hexavalent or decavalent organic group represented by the formula

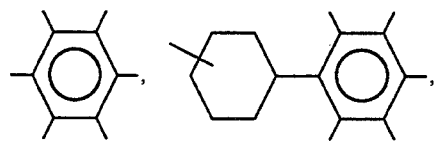

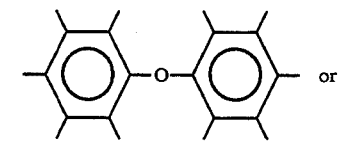

or

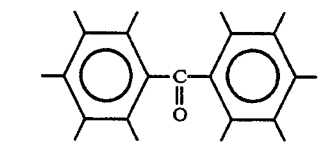

k is an integer of $1 \leq k \leq 5$, and $j+k+1$ is equal to the valence of At; m is independently 1 or 2; n is independently 0 or 1 and the values of m and n are in the range of $1 \leq m+n \leq 2$.

A method for preparing the poly(amido)imide precursor represented by the above-mentioned formula (I) will be described in detail.

The poly(amido)imide used in the present invention can be prepared by reacting, at a temperature of 0° to 100° C., a poly(amido)isoimide containing a repeating unit represented by the following formula (II), a repeating unit represented by the following formula (III) or both of these repeating units with a hydroxyphenyl group-containing compound represented by the following formula (IV):

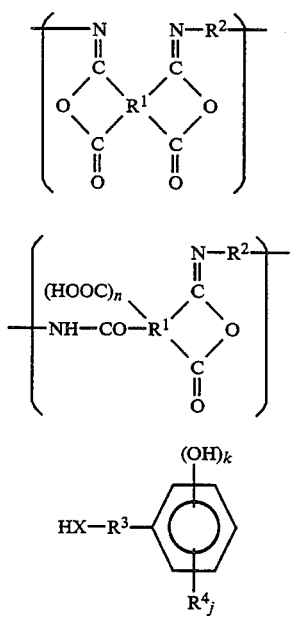

wherein $R^1$, $R^2$, $R^3$, $R^4$, X, k and j have the same meanings as mentioned above, n is independently 0 or 1.

The poly(amido)isoimide can be easily prepared by reacting tetracarboxylic dianhydride, tricarboxylic anhydride (inclusive of its derivatives; the same shall apply hereinafter) or both of them with a reaction product of a diamine in accordance with a process described on page 631 of Proceedings of Second International Conference on Polyimides (1985).

The tetracarboxylic dianhydride, the tricarboxylic anhydride and the diamine can be represented by the formulae (V), (VI) and (VII), and these materials will be described in detail:

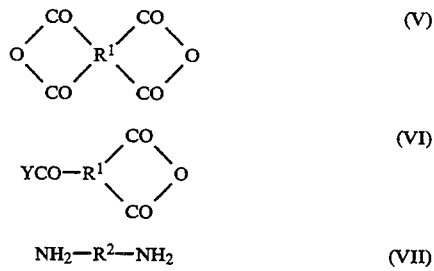

wherein $R^1$ and $R^2$ have the same meanings as mentioned above, and Y is OH or Cl.

The carbon cyclic aromatic group represented by $R^1$ preferably has at least one six-membered ring. Particularly, $R^1$ is a carbon cyclic aromatic group, a condensed polycyclic aromatic group or a polycyclic aromatic group having several condensed rings or non-condensed rings (which are bonded to each other directly or via a crosslinking group).

Suitable examples of the crosslinking group are as follows:

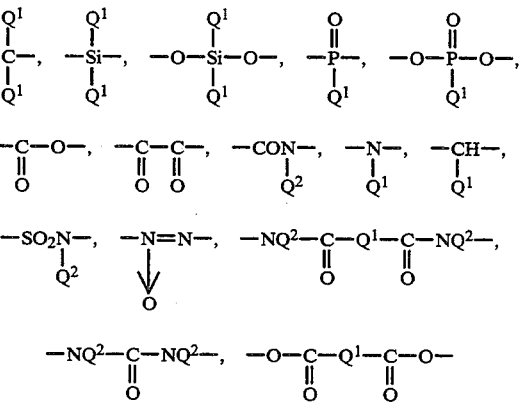

wherein $Q^1$ is an alkyl group or an alkylene group having 1 to 6 carbon atoms, preferably 1 to 4 carbon atoms, which may be substituted by one or more halogen atoms (preferably fluorine atoms), a cycloalkyl group, an aryl group or an arylene group; $Q^2$ is a hydrogen atom, a cycloalkyl group or an aryl group, or when occasion demands, an alkyl group having 1 to 4 carbon atoms substituted by one or more halogen atoms.

Furthermore, each of $Q^1$ and $Q^2$ may be a group in which the above-mentioned groups are bonded to each other via two crosslinking groups, for example, two —SO$_2$— groups.

Examples of the heterocyclic group represented by $R^1$ particularly include a five-membered or a six-membered heterocyclic aromatic group containing oxygen, nitrogen and/or sulfur, or a condensed cyclic group of the same and a benzene ring.

The carbon cyclic aromatic group or the heterocyclic group represented by $R^1$ may be substituted by, for example, one or more of nitro groups, alkyl groups having 1 to 4 carbon atoms, trifluoromethyl groups, halogen groups (particularly fluorine atoms), silyl groups or sulfamoyl groups.

The group represented by $R^1$ may not be substituted or may be substituted by, for example, one or more of halogen atoms (e.g., fluorine, chlorine or bromine), alkyl groups or alkoxy groups having 1 to 4 carbon atoms.

Examples of the preferred carbon cyclic aromatic group represented by $R^2$ include a monocyclic aromatic group, a condensed polycyclic aromatic group and a non-condensed bicyclic aromatic group. In this non-condensed bicyclic group, the aromatic rings are bonded to each other via a crosslinking group. In this case, the usable crosslinking group is the same group as mentioned in the description of $R^1$.

Examples of the heterocyclic group represented by $R^2$ particularly include five-membered and six-membered heterocyclic aromatic groups containing O, N and/or S.

Examples of the aliphatic group represented by $R^2$ particularly include an alkyl group having 2 to 12 carbon atoms and an alkylene group in which a hetero atom such as an oxygen atom, a sulfur atom or a nitrogen atom is present on an alkylene chain.

Examples of the alicyclic group represented by $R^2$ include a cyclohexyl group and a dicyclohexylmethane group, and on the other hand, examples of the aromatic aliphatic group represented by $R^2$ particularly include groups of 1,3-, 1,4- and 2,4-bis-alkylenebenzenes, a 4,4'-bis-alkylene-diphenyl group and a 4,4'-bis-alkylene-diphenyl ether group.

Preferably, $R^1$ is independently a non-substituted monocyclic aromatic group, a non-substituted condensed polycyclic aromatic group or a non-substituted non-condensed bicyclic aromatic group. In the last group, the aromatic rings are bonded to each other via a crosslinking group such as —O— or —CO—.

On the other hand, preferably, $R^2$ is independently a monocyclic aromatic group or a non-condensed bicyclic aromatic group which may have one or more of halogen atoms or alkyl groups or alkoxy groups having 1 to 4 carbon atoms, or a non-substituted monocyclic aromatic aliphatic group or a non-substituted aliphatic group having 2 to 10 carbon atoms.

The polysiloxane group of $R^2$ can be represented by the formula (VIII):

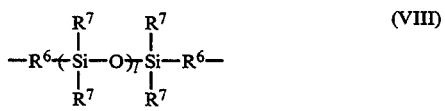

wherein $R^6$ is independently —$(CH_2)_s$—,

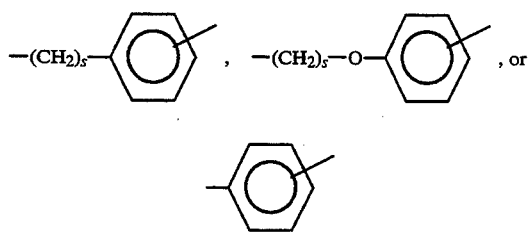

(s is an integer of from 1 to 4), $R^7$ is independently an alkyl group having 1 to 6 carbon atoms, a phenyl group or an alkyl-substituted phenyl group having 7 to 12 carbon atoms, and l is a value of $1 \leq l \leq 100$.

Examples of the tetracarboxylic dianhydride represented by the above-mentioned formula (V) include the following compounds:
pyromellitic dianhydride,
3,3',4,4'-benzophenone-tetracarboxylic dianhydride,
2,3,3',4'-benzophenone-tetracarboxylic dianhydride,
2,2',3,3'-benzophenone-tetracarboxylic dianhydride,
3,3',4,4'-diphenyl-tetracarboxylic dianhydride,
2,2',3,3'-diphenyl-tetracarboxylic dianhydride,
bis(2,3-dicarboxyphenyl)-methane dianhydride,
bis(3,4-dicarboxyphenyl)-methane dianhydride,
2,2-bis(2,3-dicarboxyphenyl)-propane dianhydride,
bis(3,4-dicarboxyphenyl)-ether dianhydride,
bis(3,4-dicarboxyphenyl)-sulfone dianhydride,
N,N-(3,4-dicarboxyphenyl)-N-methylamine dianhydride,
3,3',4,4'-tetracarboxybenzoyloxybenzene dianhydride,
2,3,6,7-naphthalene-tetracarboxylic dianhydride,
1,2,5,6-naphthalene-tetracarboxylic dianhydride,
thiophene-2,3,4,5-tetracarboxylic dianhydride,
pyrazine-2,3,5,6-tetracarboxylic dianhydride,
pyridine-2,3,5,6-tetracarboxylic dianhydride,
2,3,3',4'-biphenyltetracarboxylic dianhydride, and
2,2-bis(3,4-dicarboxyphenyl)-hexafluoropropane.

Examples of the tricarboxylic anhydride represented by the formula (VI) include the following compounds:
trimellitic anhydride,
2,3,6-naphthalenetricarboxylic anhydride,
2,3,5-naphthalenetricarboxylic anhydride,
1,2,4-naphthalenetricarboxylic anhydride,
1,2,5-naphthalenetricarboxylic anhydride,
2-(3,4-dicarboxyphenyl)-2-(3-carboxyphenyl)propane anhydride,
2-(2,3-dicarboxyphenyl)-2-(3-carboxyphenyl)propane anhydride,
1-(2,3-dicarboxyphenyl)-1-(3-carboxyphenyl)ethane anhydride,
1-(3,4-dicarboxyphenyl)-1-(4-carboxyphenyl)ethane anhydride,
(2,3-dicarboxyphenyl)(2-carboxyphenyl)methane anhydride,
1,2,3-benzenetricarboxylic anhydride,
3,3',4-tricarboxybenzophenone anhydride,
2,3,5-pyrazinetricarboxylic anhydride,
trimellitic anhydride chloride,
2,3,6-naphthalenetricarboxylic anhydride chloride,
2,3,5-naphthalenetricarboxylic anhydride chloride,
1,2,4-naphthalenetricarboxylic anhydride chloride,
1,2,5-naphthalenetricarboxylic anhydride chloride,
2-(3,4-dicarboxyphenyl)-2-(3-carboxyphenyl)propane anhydride chloride,
2-(2,3-dicarboxyphenyl)-2-(3-carboxyphenyl)propane anhydride chloride,
1-(2,3-dicarboxyphenyl)-1-(3-carboxyphenyl)ethane anhydride chloride,
1-(3,4-dicarboxyphenyl)-1-(4-carboxyphenyl)ethane anhydride chloride,
(2,3-dicarboxyphenyl)(2-carboxyphenyl)methane anhydride chloride,
1,2,3-benzenetricarboxylic anhydride chloride,
3,3',4-tricarboxybenzophenone anhydride chloride, and
2,3,5-pyrazinetricarboxylic anhydride chloride.

As the diamine represented by the formula (VII), known compounds can be used.

Examples of the carbon cyclic aromatic diamine particularly include the following compounds:
o-, m- and p-phenylenediamine, diaminotoluenes (e.g., 2,4-diaminotoluene), 1,4-diamino-2-methoxybenzene, 2,5-diaminoxylenes, 1,3-diamino-4-chlorobenzene, 1,4-diamino-2,5-dichlorobenzene, 1,4-diamino-2-bromobenzene, 1,3-diamino-4-isopropylbenzene, N,N'-diphenyl-1,4-phenylenediamine, 4,4'-diaminodiphenyl-2,2-propane, 4,4'-diaminodiphenylmethane, 2,2'-diaminostilbene, 4,4'-diaminostilbene, 4,4'-diaminodiphenyl ether, 4,4'-diaminodiphenyl thioether, 4,4'-diaminodiphenylsulfone, 3,3'-diaminodiphenylsulfone, phenyl 4,4'-diaminobenzoate, 2,2'-diaminobenzophenone, 4,4'-diaminobenzophenone, 4,4'-diaminobenzyl, 4-(4'-aminophenylcarbamoyl)-aniline, bis(4-aminophenyl)-phosphine oxide, bis(4-aminophenyl)-methyl-phosphine oxide, bis(3-aminophenyl)-methylsulfine oxide, bis(4-aminophenyl)-phenylphosphine oxide, bis(4-aminophenyl)-cyclohexylphosphine oxide, N,N-bis(4-aminophenyl)-N-phenylamine, N,N-bis(4-aminophenyl)-N-methylamine, 4,4'-diaminodiphenylurea, 1,8-diaminonaphthalene, 1,5-diaminonaphthalene, 1,5-diaminoanthraquinone, diaminofluoranthene, bis(4-aminophenyl)-diethylsilane, bis(4-aminophenyl)-dimethylsilane, bis(4-aminophenyl)-tetramethyldisiloxane, 3,4'-diaminodiphenyl ether, benzidine, 2,2'-dimethylbenzidine, 2,2-bis[4-(4-aminophenoxy)phenyl]propane, bis[4-(4-aminophenoxy)phenyl]sulfone, 4,4'-bis(4-aminophenoxy)biphenyl, 2,2-bis[4-(4-aminophenoxy)phenyl]hexafluoropropane, 1,4-bis(4-aminophenoxy)benzene, 1,3-bis(4-aminophenoxy)benzene and the like.

Examples of the heterocyclic diamines include the following compounds:

2,6-diaminopyridine, 2,4-diaminopyridine, 2,4-diamino-s-triazine, 2,7-diamino-dibenzofuran, 2,7-diaminocarbazole, 3,7-diaminophenothiazine, 2,5-diamino-1,3,4-thiaziazole, 2,4-diamino-6-phenyl-s-triazine and the like.

Furthermore, examples of the aliphatic diamine include the following compounds:

Dimethylamine, trimethylenediamine, tetramethylenediamine, hexamethylenediamine, heptamethylenediamine, octamethylenediamine, nonamethylenediamine, decamethylenediamine, 2,2-dimethylpropylenediamine, 2,5-dimethylhexamethylenediamine, 2,5-dimethylheptamethylenediamine, 4,4-dimethylheptamethylenediamine, 3-methylheptamethylenediamine, 3-methoxyheptamethylenediamine, 5-methylnonamethylenediamine, 2,11-diaminododecane, 1,12-diaminooctadecane, 1,2-bis(3-aminopropoxy)ethane, N,N'-dimethylethylenediamine, N,N'-diethyl-1,3-diaminopropane, N,N'-dimethyl-1,6-diaminohexane, diamines represented by the formula $H_2N(CH_2)_3O(CH_2)_2O(CH_2)_3NH_2$ and the like.

Furthermore, suitable exemplary compounds of the alicyclic diamine include 1,4-diaminocyclohexane, 4,4'-diamino-dicyclohexylmethane and the like. Suitable examples of the aromatic aliphatic diamine include 1,4-bis(2-methyl-4-aminopentyl)-benzene, 1,4-bis(1,1-dimethyl-5-aminopentyl)-benzene, 1,3-bis(aminomethyl)-benzene, 1,4-bis(aminomethyl)-benzene and the like.

Moreover, examples of the diaminopolysiloxane include the following compounds:

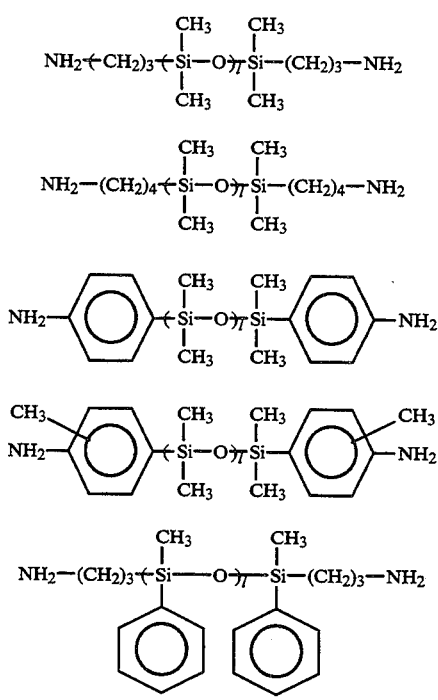

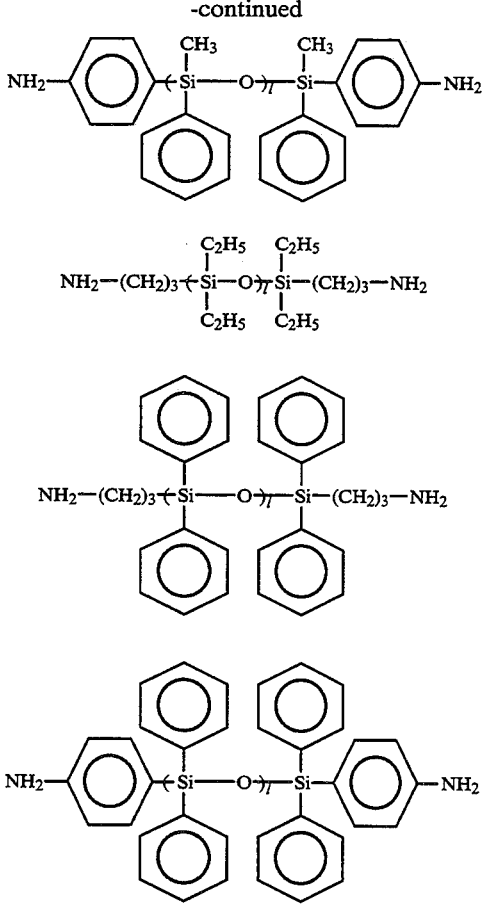

and the like.

Next, the hydroxyphenyl group-containing compound represented by the formula (IV) will be described.

In the formula (IV), $R^3$ preferably is a divalent organic group having 1 to 10 carbon atoms, i.e., a residue such as an aliphatic group, an alicyclic group, an aromatic group or an aromatic aliphatic group. However, this kind of group may contain a polar group such as a hydroxyl group, a carboxyl group, an ether, an ester, a ketone or the like. $R^4$ is a hydrogen atom or an organic group having 1 to 20 carbon atoms such as an aliphatic group, an alicyclic group, an aromatic group or an aromatic aliphatic group. However, this kind of group may contain a polar group such as a hydroxyl group, a carboxyl group, an ether, an ester, a ketone or the like. $R^1$ preferably is an organic group having 1 to 10 carbon atoms. $R^5$ preferably is a hydrogen atom or an organic group having 1 to 10 carbon atoms such as an aliphatic group or an alkoxy group. However, this kind of group may contain a polar group such as a hydroxyl group, a carboxyl group, an ether, an ester, a ketone or the like.

Examples of the compound represented by the formula (IV) include the following compounds:

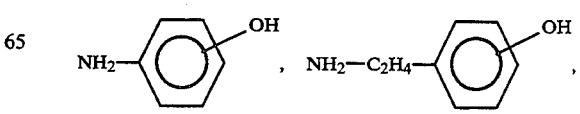

-continued

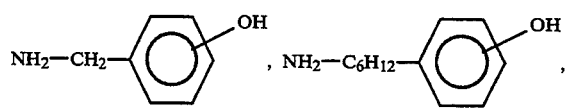
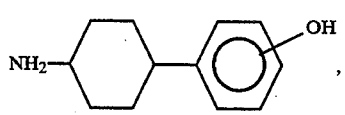
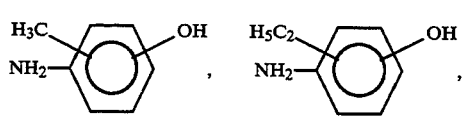
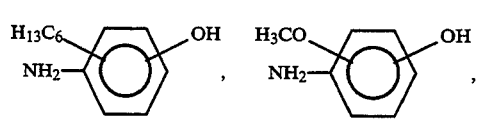
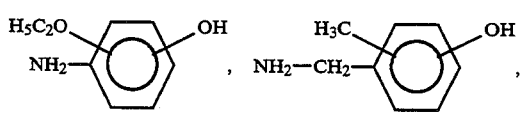
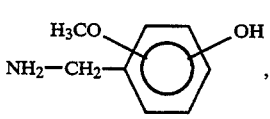
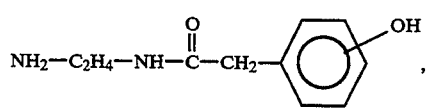
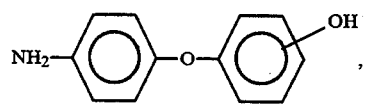
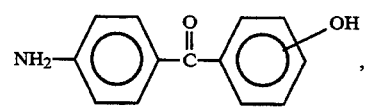
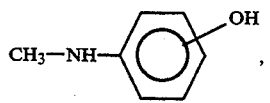
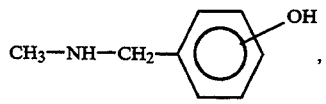
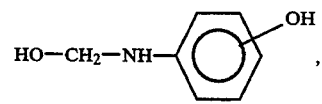
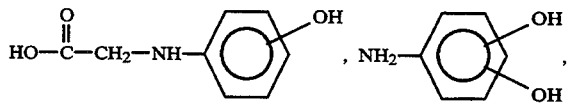

-continued

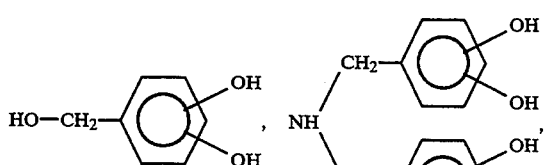
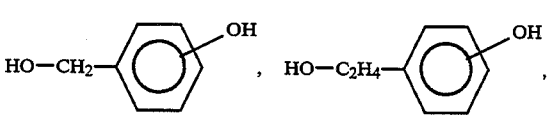
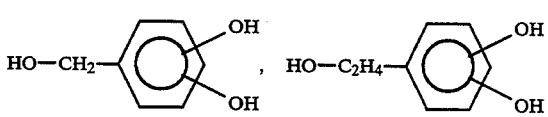

and the like.

Preferable solvents which can be used in preparing the poly(amido)imide precursor represented by the above-mentioned formula (I) (hereinafter referred to as "reaction solvent" at times) are as follows:

N-methyl-2-pyrrolidone, N,N-dimethylacetamide, N,N-dimethylformamide, dimethyl sulfoxide, tetramethylurea, pyridine, dimethylsulfone, hexamethylphosphoramide, methylformamide, N-acetyl-2-pyrrolidone, ethylene glycol monomethyl ether, ethylene glycol monoethyl ether, ethylene glycol monobutyl ether, diethylene glycol monomethyl ether, diethylene glycol dimethyl ether, cyclopentanone, cyclohexanone, cresol, γ-butyrolactone, N,N-diethylacetamide, N,N-diethylformamide, N,N-dimethylmethoxyacetamide, tetrahydrofuran, N-acetyl-2-pyrrolidone, N-methyl-ε-caprolactam, tetrahydrothiophene dioxide (sulpholane) and the like.

Furthermore, this reaction can be carried out in a mixed solvent which can be obtained by mixing the above-mentioned organic solvents. The above-mentioned preferred organic solvent, when used, can be diluted with another non-protonic (neutral) organic solvent such as an aromatic, an alicyclic or an aliphatic hydrocarbon or its chlorinated derivative (e.g., benzene, toluene, xylene, cyclohexane, pentane, hexane, petroleum ether or methylene chloride), or it can be diluted with dioxane.

In the presence of the above-mentioned solvent, the poly(amide)amic acid can be synthesized from the above-mentioned acid anhydride and diamine by a known process. In this case, for the purpose of improving the adhesion to a substrate, an aminosilane represented by the following formula (IX) can be introduced to the terminal of the polymer.

$$NH_2-R^8-SiR^9{}_{3-h}Z_h \qquad (IX)$$

[wherein $R^8$ is $-(CH_2)_s-$,

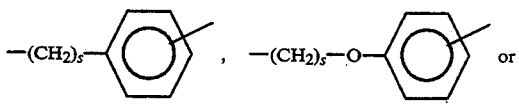

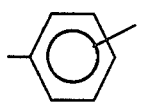

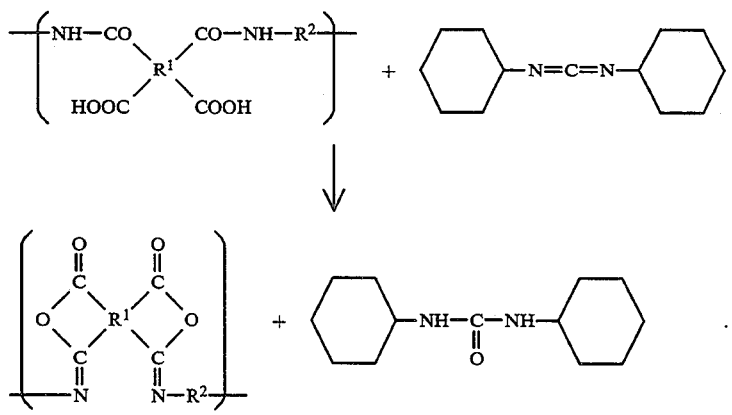

on Polyimides. This reaction can be represented by the following reaction formula. In this case, an imido group is formed on occasion, depending upon reaction conditions.

(s is an integer of from 1 to 4), $R^9$ is independently an alkyl group having 1 to 6 carbon atoms, a phenyl group or an alkyl-substituted phenyl group substituted by an alkyl group having 7 to 12 carbon atoms, Z is independently a hydrolyzable alkoxy group, an acetoxy group or a halogen, and h is a value of $1 \leq h \leq 3$].

Next, examples of the aminosilane represented by the formula (IX) include the following compounds:

Aminomethyl-di-n-propoxymethylsilane, (β-aminoethyl)-di-n-propoxymethylsilane, (β-aminoethyl)-diethoxyphenylsilane, (β-aminoethyl)-tri-n-propoxysilane, (β-aminoethyl)-dimethoxymethylsilane, (γ-aminopropyl)-di-n-propoxymethylsilane, (γ-aminopropyl)-di-n-butoxymethylsilane, (γ-aminopropyl)-trimethoxysilane, (γ-aminopropyl)-triethylsilane, (γ-aminopropyl)-di-n-pentoxy-phenylsilane, (γ-aminopropyl)methoxy-n-propoxymethylsilane, (δ-aminobutyl)-dimethoxymethylsilane, (3-aminophenyl)-di-n-propoxymethylsilane, (4-aminophenyl)-tri-n-propoxysilane, [β-(4-aminophenyl)-ethyl]-diethoxy-methylsilane, [β-(3-aminophenyl)-ethyl]-di-n-propoxy-phenylsilane, [γ-(4-aminophenyl)-propyl]-di-n-propoxy-methylsilane, [γ-(4-aminophenoxy)-propyl]-di-n-propoxy-methylsilane, [γ-(3-aminophenoxy)-propyl]-di-n-butoxy-methylsilane, (γ-aminopropyl)-methyl-dimethoxysilane, (γ-aminopropyl)-methyl-diethoxysilane, (γ-aminopropyl)-ethyl-di-n-propoxysilane, 4-aminophenyl-trimethoxysilane, 3-aminophenylmethoxysilane, 4-aminophenyl-methyl-di-methoxysilane, 3-aminophenyl-dimethyl-methoxysilane, 4-aminophenyl-tri-ethoxysilane and the like.

In addition to these compounds, a monofunctional acid anhydride or amine can be added to the reaction system for the purpose of controlling the molecular weight of the poly(amide)amic acid. Examples of such a monofunctional compound include the following compounds:

phthalic anhydride, maleic anhydride, aniline, monoallyamine and the like.

The thus synthesized polyamic acid can be easily converted into a polyisoimide with the aid of, for example, a dehydrating agent such as N,N'-dicyclohexylcarbodiimide, trifluoroacetic anhydride or the like in accordance with the process described in the above-mentioned Proceeding of Second International Conference on Polyimides. Although the exemplary reaction with the polyamic acid by the use of N,N'-dicyclohexylcarbodiimide as the dehydrating agent is shown above, it is not always the case that all of amic acid is converted into the isoimide. However, when the amount of the isoimide groups in the polymer decreases, the ratio of the hydroxyphenyl group-containing amine to be added also decreases, so that sensitivity deteriorates. For this reason, it is preferred that the conversion into the isoimide is achieved as much as possible.

Next, the compound represented by the formula (IV) is added to this poly(amido)isoimide, and the reaction is then carried out in the presence of a reaction solvent. The amount of the compound to be added may be more or less than the equimolar amount to the isoimide, but it is preferably in the vicinity of the equimolar amount. A reaction temperature is in the range of from 0° to 100° C., preferably from about 10° to about 30° C. A reaction time is preferably in the range of from 0.2 to 30 hours, more preferably from about 1 to about 10 hours.

In this way, the poly(amido)imide precursor represented by the formula (I) can be obtained. The logarithmic viscosity number of this polymer is preferably in the range of from 0.1 to 5 dl/g from the viewpoint of film-forming properties. Here, the logarithmic viscosity number is ηinh which can be defined by the formula $$\eta\text{inh} = \frac{\ln \eta/\eta_o}{C}$$

(wherein η is a value measured in a solvent at a temperature of 30°±0.01° C. at a concentration of 0.5 g/dl by the use of a Ubbelohde's viscometer, $\eta_o$ is a value of the same solvent at the same temperature by the use of the same viscometer, and C is a concentration of 0.5 g/dl).

The poly(amido)imide precursor represented by the formula (I) can be stored in a stable state as a solution. However, this solution may be added to a large amount of a non-solvent and the precipitated polymer is collected by filtration and then dried to obtain a powdery or massy solid, and the polymer can be stored in the form of such a solid.

The photosensitive polymer composition of the present invention can be composed of the poly(amido)imide precursor having the repeating unit represented by the above-mentioned formula (I), at least one quinonediazide compound as a photosensitizing agent and a solvent.

The poly(amido)imide precursor contains the repeating unit represented by the above-mentioned formula (I), but it is not always necessary that this kind of repeating unit is present in a ratio of 100 mol %. However, in practice, it is preferred that this repeating unit is present in a ratio of 30 mol % or more of all the repeating units. No particular restriction is put on repeating units other than the repeating unit represented by the formula (I), but the following repeating units are practically used singly or in combination.

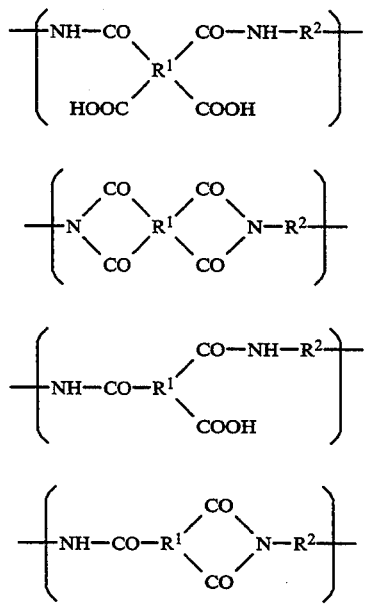

The concentration of the poly(amido)imide precursor in the photosensitive polymer composition is from 2 to 50% by weight, preferably from 10 to 30% by weight.

No particular restriction is put on the quinonediazide compound as a photosensitizing agent, and examples of the quinonediazide compound include orthobenzoquinonediazide compounds, orthonaphthoquinonediazide compounds and esters of these compounds and compounds having a free hydroxyl group, but preferable are the orthonaphthoquinonediazide compounds and the esters of orthonaphthoquinonediazide compounds and compounds having a free hydroxyl group. Typical preferable examples of the quinonediazide compound include hydroxybenzophenone, its derivatives, gallic acid, its derivatives, and esters of bisphenol derivatives such as 4,4'-isopropylidenediphenol, 4,4'-bis(4-hydroxyphenyl)sulfone and 2,2-bis(4-hydroxyphenyl)hexafluoropropane and orthonaphthoquinonediazide sulfonylchloride.

With regard to the ratio of the quinonediazide compound to the poly(amido)imide precursor in the photosensitive polymer composition of the present invention, the amount of the quinonediazide compound is from 5 to 50 parts by weight, preferably from 10 to 30 parts by weight with respect to 100 parts by weight of the poly(amido)imide precursor.

When the content of the quinonediazide compound is less than 5 parts by weight to 100 parts by weight of the poly(amido)imide precursor, a difference between the solubilities of exposed and unexposed portions in a developing solution is not sufficient, so that a pattern having excellent contrast cannot be obtained. Conversely, when it is more than 50 parts by weight, film-forming properties are poor, and the obtained films are brittle and inconveniently tend to peel from substrates.

The photosensitive polymer composition can be obtained by dissolving the poly(amido)imide precursor and the quinonediazide compound as the photosensitizing agent in the above-mentioned reaction solvent in the above-mentioned mixing ratio.

Next, the method for forming the patterned poly(amido)imide film by the use of the polymer composition of the present invention will be described. The polymer composition of the present invention can be applied to a substrate such as a silicone wafer, a metal plate, a plastic plate or a glass plate in a known manner such as spin coat, dipping or spray printing. The coating film is prebaked at a temperature of from 30° to 150° C. for a period of several minutes to several tens minutes by a heating means such as an electric furnace or a hot plate to remove most of the solvent present in the coating film therefrom. Examples of the actinic radiation include X-rays, electron beams, ultraviolet rays, far ultraviolet rays and visible rays, but above all, the ultraviolet rays and the far ultraviolet rays are particularly suitable.

Next, the exposed portions on the coating film are dissolved and removed with a developing solution comprising a basic water-soluble solution to obtain a positive type relief pattern. Here, the basic water-soluble solution can be obtained by dissolving a basic substance in a solvent comprising 50 to 100 parts by weight of water and 50 to 0 parts by weight of a water-soluble organic solvent. Furthermore, when the unexposed portions are dissolved and removed with a developing solution comprising a basic solution, a negative type relief pattern can be also obtained. Here, the basic solution can be obtained by dissolving a basic substance in a solvent comprising 0 to 10 parts by weight of water and 100 to 90 parts by weight of a water-soluble organic solvent.

Examples of the basic substance include inorganic alkalis such as sodium hydroxide, potassium hydroxide, sodium carbonate, sodium silicate, sodium metasilicate and aqueous ammonia; primary amines such as ethylamine and n-propylamine; secondary amines such as diethylamine and di-n-propylamine; tertiary amines such as triethylamine and methyldiethylamine; and quaternary amines such as tetramethylammonium hydroxide and trimethylhydroxyethylammonium hydroxide.

Examples of the above-mentioned water-soluble organic solvent include polar solvents, for example, monovalent and polyvalent, preferably divalent to hexavalent alcohols, N,N-dimethylformamide, N,N-dimethylacetamide, dimethyl sulfoxide, tetrahydrofuran, N-methylpyrrolidone, glycols such as ethylene glycol, ethylene glycol monomethyl ether acetate, ethylene glycol monoethyl ether, ethylene glycol isopropyl ether, ethylene glycol monobutyl ether, ethylene glycol monoacetate, diethylene glycol, diethylene glycol monomethyl ether, diethylene glycol monoethyl ether, diethylene glycol monoethyl ether acetate, diethylene glycol monobutyl ether, diethylene glycol diethyl ether, diethylene glycol acetate, triethylene glycol, triethylene glycol monomethyl ether, triethylene glycol monoethyl ether, propylene glycol, propylene glycol monomethyl ether, propylene glycol monoethyl ether, dipropylene glycol, dipropylene glycol monomethyl ether, dipropylene glycol monoethyl ether, tripropylene glycol monomethyl ether, trimethylene glycol and butanediol.

A typical example of the preferred developing solution which can be used to obtain the positive type relief pattern is a basic water-soluble solution prepared by dissolving 0.3 to 10.0 parts by weight of tetramethylammonium hydroxide in a solution comprising 50 to 100 parts by weight of water and 50 to 0 part by weight of an alcohol. When the amount of water is less than 50 parts by weight, film loss unpreferably increases at the time of the development of unexposed portions. On the contrary, a typical example of the developing solution which is used to obtain the negative type relief pattern is a basic solution prepared by dissolving 0.1 to 2.0 parts by weight of tetramethylammonium hydroxide in a solvent comprising 0 to 10 parts by weight of water and 100 to 90 parts by weight of an alcohol. When the amount of water is more than 10 parts by weight, the unexposed portions cannot be dissolved and removed inconveniently.

If necessary, the relief pattern can be stabilized by rinsing it in water or an alcohol solution, and then drying it at a temperature of 150° C. or less. Furthermore, the film can be peeled from the substrate at any time after prebaking, and it can be used as an unsupported film.

The relief pattern polymer formed by the development is in the form of the precursor. Therefore, the polymer is then heated at a temperature of from 200° to 500° C., preferably from 300° to 400° C. for a period of several tens of minutes to several hours by the use of the above-mentioned heating means to form a patterned poly(amido)imide film. In this case, the chemical reaction proceeds as shown below, and the photosensitizing agent and the hydroxy compound introduced into the polyamic acid are volatilized by the thermal decomposition to form the poly(amido)imide film:

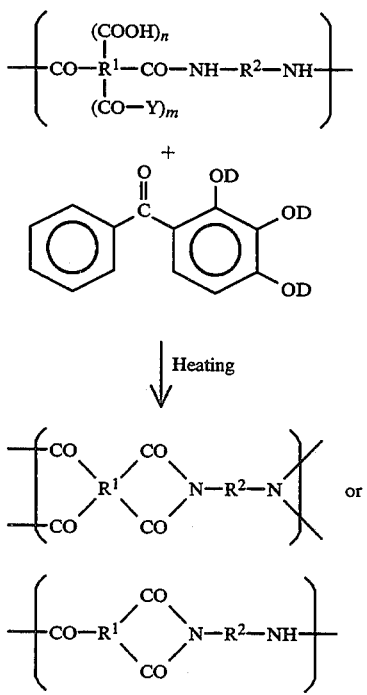

wherein D represents

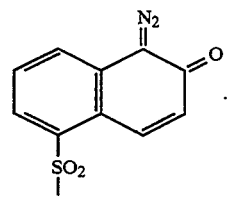

Thus, the patterned heat-resistant poly(amido)imide film can be obtained from the photosensitive polymer of the present invention.

The photosensitive polymer of the present invention can be applied to electronic materials, particularly passivation films for semiconductors and printed circuits.

BRIEF DESCRIPTION OF THE DRAWINGS

FIG. 1 is an infrared absorption spectrum of a polymer of the present invention obtained in Example 1.

In FIG. 2, absorptions attributed to an imido group intensively appear at 1780 cm$^{-1}$ and 720 cm$^{-1}$.

BEST MODE FOR CARRYING OUT THE INVENTION

Figure 2:
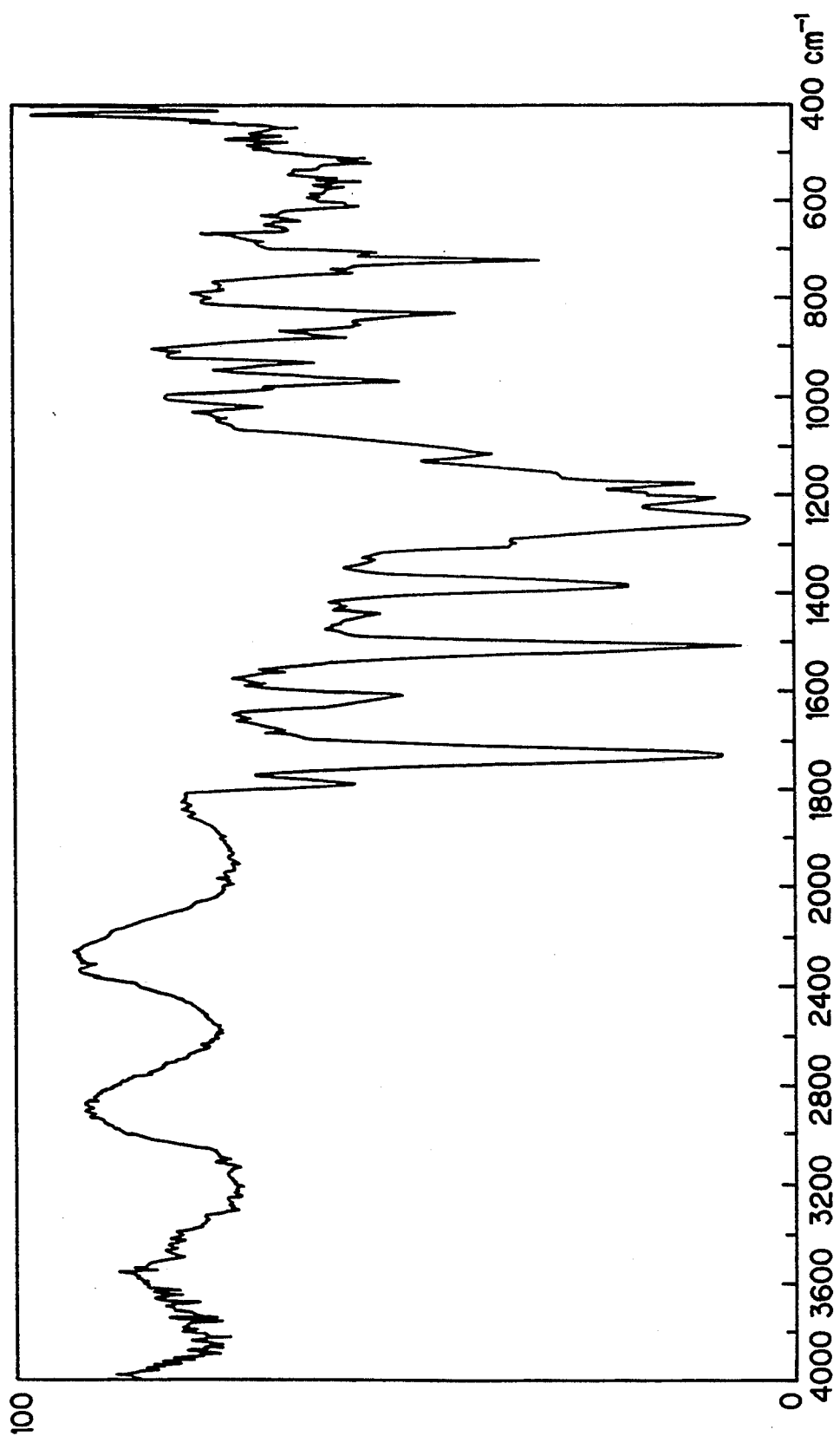
FIG. 2 is an infrared absorption spectrum of a photosensitive polymer composition after calcination in Example 1.

The present invention will be described in more detail with reference to the following examples, but these examples are not intended to limit the present invention. (Synthesis Example 1 of Poly(amido)imide Precursor)

A 1-liter flask equipped with a stirrer, a dropping funnel, a thermometer, a condenser and a nitrogen replacer was fixed in a thermostatic chamber. 531.2 g of dehydrated and purified N-methyl-2-pyrrolidone (hereinafter referred to simply as "NMP"), 48.63 g (0.0938 mol) of 2,2-bis[4-(4-aminophenoxy)phenyl]hexafluoropropane (hereinafter referred to simply as "HFBAPP") and 0.69 g (0.0-063 mol) of p-aminophenol were then placed in the flask, and stirring was continued to dissolve them. Furthermore, 44.42 g (0.100 mol) of hexafluoroisopropylidene-2,2-bis(phthalic anhydride) (hereinafter referred to simply as "6FDA") was added to the solution, and reaction was then carried out at 20°-30° C. for 8 hours, thereby obtaining a polyamic acid in which p-aminophenol was added to a terminal. Afterward, 45.39 g (0.220 mol) of N,N'-dicyclohexylcarbodiimide (hereinafter referred to simply as "DCC") was added to the solution, and the reaction was further carried out at this temperature for 30 minutes to achieve polyisoimidation. Next, 24.00 g (0.22 mol) of p-aminophenol were added, followed by reaction at 20°-30° C. for 12 hours. After the resultant white precipitate of N,N'-dicyclohexylurea was removed from the solution by filtration, the solution was poured into a large amount of ethanol to deposit a poly(amido)imide precursor of the present invention. This product was collected by filtration and then dried at 50° C. under reduced pressure a whole day and night to isolate the product.

The logarithmic viscosity number of the thus obtained polymer of the present invention in NMP was 1.10 dl/g. The infrared absorption spectrum of this polymer is shown in FIG. 1.

(Synthesis Examples 2 to 7 of Poly(amido)imide Precursor)

The same procedure as in Synthesis Example 1 was effected except that synthetic conditions described in Table 1 were used, to synthesize poly(amido)imide precursors. The results are set forth in Table 1.

(Examples 1 to 10)

20.0 g of each polymer of the present invention synthesized in Synthesis Examples 1 to 7 was dissolved in 60.0 g of NMP, and an orthonaphthoquinonediazide compound was suitably added to the resultant solution to prepare a photosensitive polymer composition.

This composition was spin-coated on a silicone wafer, and the latter was then prebaked at 110° C. for 30 minutes to form a uniform film thereon. Next, this film was exposed through a mask to the light from an ultrahigh pressure mercury vapor lamp (20 mW/cm$^2$) for various irradiation times, and then immersed in an alkali developing solution to develop the film. This developed film was rinsed with water and then dried, whereby a fresh relief pattern was obtained. Each exposure necessary to resolve a hole pattern having a diameter of 10 μm is set forth as sensitivity in Table 2. Each relief pattern was calcined at 150° C. for 60 minutes and additionally at 400° C. for 60 minutes in an electric furnace, and as a result, the pattern did not crumble. According to the infrared absorption spectra of the polymers, it was confirmed that every photosensitive polymer, after the calcination, was converted into the poly(amido)imide. The infrared absorption spectrum of the photosensitive polymer composition after calcination in Example 1 is shown in FIG. 2.

Furthermore, in order to inspect the stability of these photosensitive polymers with time, the rotational viscosities* of the respective photosensitive polymer compositions were measured immediately after the preparation of these compositions and after they were allowed to stand at room temperature for 1 month. The photosensitive compositions of the examples and the detailed values of the measured results are set forth in Table 2.

*The rotational viscosity was a viscosity measured at a temperature of 25° C. by the use of an E type viscometer (trade name VISCONIC EMD made by Tokyo Keiki Co., Ltd.).

TABLE 2 (I)

| Example & Comp. Ex. | Polymer (g) | Quinonediazide Compound (g) | Photopolymerization Initiator or Sensitizer (g) |
|---|---|---|---|
| Example 1 | Polymer in Synthesis Ex. 1 20.0 | S-1[*6] 2.0 | — |
| Example 2 | Polymer in Synthesis Ex. 2 20.0 | S-1 2.0 | — |
| Example 3 | Polymer in Synthesis Ex. 3 20.0 | S-1 2.0 | — |
| Example 4 | Polymer in Synthesis Ex. 4 20.0 | S-1 2.0 | — |
| Example 5 | Polymer in Synthesis Ex. 5 20.0 | S-1 2.0 | — |
| Example 6 | Polymer in Synthesis Ex. 6 20.0 | S-1 2.0 | — |

Note: [*6]S-1: Triester of 1,2-naphthoquinonediazido-5-sulfonic acid and 2,3,4-hydroxybenzophenone.

TABLE 2 (II)

| Example & Comp. Ex. | Polymer (g) | Quinonediazide Compound (g) | Photopolymerization Initiator or Sensitizer (g) |
|---|---|---|---|
| Example 7 | Polymer in Synthesis Ex. 7 20.0 | S-1 2.0 | — |
| Example 8 | Polymer in Synthesis Ex. 1 20.0 | S-1 5.0 | — |
| Example 9 | Polymer in Synthesis Ex. 2 20.0 | S-1 5.0 | — |
| Example 10 | Polymer in Synthesis Ex. 3 20.0 | S-1 5.0 | — |
| Comp. Ex. 1 | Comp. Ex. 1 | — | Michler's Ketone 0.45 |

TABLE 1

| Synthesis Example | NMP (g) | Diamine (g) | Tetracarboxylic Dianhydride (g) | Adduct (g) | | Logarithmic Viscosity Number |
|---|---|---|---|---|---|---|
| 2 | 532.2 | HFBAPP p-hydroxy-phenethyl-amine | 48.63 0.86 | 6FDA | 44.42 p-hydroxy-phenethyl-amine 30.18 | 1.15 |
| 3 | 532.2 | HFBAPP p-hydroxy-phenetyl-amine | 48.63 0.86 | 6FDA | 44.42 p-hydroxy-benzyl-alcohol 27.30 | 1.12 |
| 4 | 392.4 | DDS[*1] | 24.83 | 6FDA | 44.42 p-hydroxy-benzyl-alcohol 27.30 | 0.95 |
| 5 | 392.4 | DDS | 24.83 | 6FDA | 44.42 p-amino-phenol 24.00 | 0.90 |
| 6 | 295.9 | DDE[*2] | 20.00 | BTDA[*3] | 32.22 p-amino-phenol 24.00 | 1.20 |
| 7 | 236.9 | DDE | 20.00 | PMDA[*4] | 21.81 p-amino-phenol 24.00 | 1.18 |

Notes:
[*1]DDS: 3,3'-diaminodiphenylsulfone
[*2]DDE: 4,4'-diaminodiphenyl ether
[*3]BTDA: 3,4,3',4'-benzophenonetetracarboxylic dianhydride
[*4]PMDA: Pyromellitic anhydride

TABLE 2 (III)

| Example & Comp. Ex. | Developing Solution | Sensitivity mJ/cm² | Final Film Thickness μm | Rotational Viscosity after 1 month/ just after preparation |
|---|---|---|---|---|
| Example 1 | D-1*7) | 150 | 5.2 | 1830/1870 |
| Example 2 | D-1 | 100 | 5.0 | 1880/1920 |
| Example 3 | D-1 | 105 | 5.1 | 1860/1900 |
| Example 4 | D-1 | 95 | 4.9 | 1700/1730 |
| Example 5 | D-1 | 110 | 4.9 | 1680/1710 |
| Example 6 | D-1 | 200 | 4.8 | 1920/1980 |
| Example 7 | D-1 | 180 | 4.9 | 1890/1930 |
| Example 8 | D-2*8) | 75 | 5.1 | 1800/1850 |
| Example 9 | D-2 | 60 | 4.9 | 1860/1900 |
| Example 10 | D-2 | 55 | 4.8 | 1840/1880 |
| Comp. Ex. 1 | NMP | 1000 | 4.5 | 680/1820 |

Notes:
*7)D-1: Solution of 75 parts of 2.0% by weight tetramethylammonium hydroxide and 25 parts of isopropyl alcohol.
*8)D-2: An isopropyl alcohol solution of 0.3% by weight tetramethylammonium hydroxide.

(Comparative Syntheis Example 1)

The same device and the same procedure as in Example 1 were utilized, and a polyamic acid solution having a logarithmic viscosity number of 1.1 dl/g was synthesized from 100 g of NMP, 12.34 g (0.0383 mol) of BTDA and 7.66 g (0.0383 mol) of DDE. Afterward, 14.19 g (0.0766 mol) of dimethylaminoethyl methacrylate was mixed with this solution to obtain a photosensitive polymer solution. 30 g of this solution was sampled, and an additive shown in Table 1 was added thereto. Next, in the same manner as in Example 1, a photosensitive test and the stability of the photosensitive polymer composition with time were measured. The results are shown in Table 2.

Possibility of Industrial Utilization

A novel poly(amido)imide precursor of the present invention can be easily prepared by a method described in this specification. The photosensitive polymer composition which is a solution containing less impurities obtained by adding a suitable amount of a quinonediazide compound to the precursor and then dissolving the same in a solvent has a practically sufficient sensitivity and permits forming good positive and negative patterns. In addition, the photosensitive polymer composition of the present invention is excellent in shelf stability, so that the change of a film thickness with time is small.

We claim:

1. A method of preparing a negative type pattern of a polyimide film which comprises:
    applying to a substrate a sufficient amount of a photosensitive polymer composition to form a negative type pattern, said photosensitive polymer composition comprising a mixture of a poly(amido) imide precursor containing a repeating unit represented by the following formula (I), at least one kind of quinonediazide compound and an organic solvent:

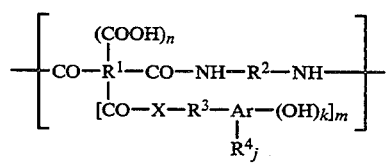

(I)

wherein $R^1$ is a trivalent or a tetravalent carbocyclic aromatic group or heterocyclic group; $R^2$ is an aliphatic group having at least two carbon atoms, an alicyclic group, an aromatic aliphatic group, a carbocyclic aromatic group, a heterocyclic group or a polysiloxane group; X is —O— or $NR^5$—, where $R^5$ is a hydrogen atom or a monovalent organic group having 10 or less carbon atoms; $R^3$ is a divalent organic group; $R^4$ is a hydrogen atom or a monovalent organic group having 20 or less carbon atoms; Ar is a hexavalent or decavalent organic group represented by the formula

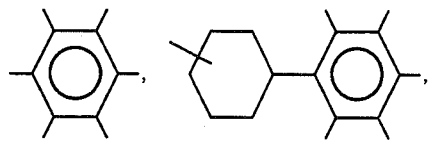

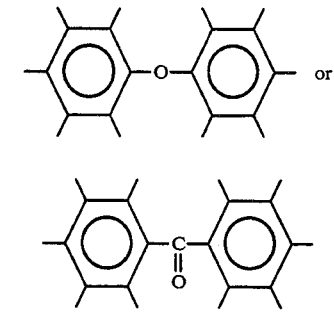

k is an integer of $1 \leq k \leq 5$, and $j+k+1$ is equal to the valence of At; m is independently 1 or 2; n is independently 0 or 1 and the values of m and n are in the range of $1 \leq m+n \leq 2$;
    prebaking the composition at 50°–130° C.;
    irradiating the composition through a mask with actinic radiation to form an irradiated composition;
    developing the irradiated composition with a developing solution comprising a basic solution of a basic substance in a solvent comprising 0 to 10 parts by weight of water and 100 to 90 parts by weight of a water-soluble organic solvent to remove unexposed portions of the composition and form a negative type pattern;
    rinsing and drying the pattern; and
    post-baking the pattern at 200°–500° C.

2. The method for preparing a negative type pattern according to claim 1 wherein the developing solution is a basic solution of 0.1 to 2.0 parts by weight of tetramethylammonium hydroxide in 100 parts by weight of a solvent comprising 0 to 10 parts by weight of water and 100 to 90 parts by weight of a water-soluble organic solvent.

3. The method according to claim 1 wherein said repeating unit of said precursor is contained in an amount of at least 30 mol percent based on the total of all repeating units.

4. The method according to claim 1 wherein said quinonediazide compound is present in an amount of 5 to 50 parts by weight based on 100 parts by weight of said poly(amido)imide precursor.

5. The method according to claim 1 wherein said poly(amido) imide precursor is present in an amount of 2 to 50 percent by weight, based on the total weight of the composition.

* * * * *

UNITED STATES PATENT AND TRADEMARK OFFICE
CERTIFICATE OF CORRECTION

PATENT NO. : 5,342,739
DATED : August 30, 1994
INVENTOR(S) : Katou et al.

It is certified that error appears in the above-indentified patent and that said Letters Patent is hereby corrected as shown below:

```
Title page, Abstract,
Item 57, line 11, before "R¹" insert --Wherein--;
        page 2, line 26, change "C.;" to --C;--;

Column 20, line 34, change "At" to --Ar --.
```

Signed and Sealed this

Third Day of January, 1995

*Attest:*

BRUCE LEHMAN

*Attesting Officer*   *Commissioner of Patents and Trademarks*